INVENTORS
HANS R. CAMENZIND
ALAN B. GREBENE
BY
Flehr, Hohbach, Test, Albritton & Herbert
ATTORNEYS INVENTORS
HANS R. CAMENZIND
ALAN B. GREBENE
BY
Flehr, Hohbach, Test,
Albritton & Herbert
ATTORNEYS Feb. 16, 1971 H. R. CAMENZIND ET AL 3,564,434

INTEGRATED FREQUENCY SELECTIVE CIRCUIT AND DEMODULATOR INCLUDING PHASE LOCKED LOOP

Filed July 29, 1968 4 Sheets-Sheet 3

INVENTORS
HANS R. CAMENZIND
ALAN B. GREBENE

BY Flehr, Hohbach, Test, Albritton & Herbert
ATTORNEYS

INVENTORS
HANS R. CAMENZIND
ALAN B. GREBENE
BY
Flehr, Hohbach, Test, Albritton & Herbert
ATTORNEYS 3,564,434

INTEGRATED FREQUENCY SELECTIVE CIRCUIT AND DEMODULATOR INCLUDING PHASE LOCKED LOOP

Hans R. Camenzind, Los Altos, and Alan B. Grebene, Sunnyvale, Calif., assignors to Signetics Corporation, Sunnyvale, Calif., a corporation of California Filed July 29, 1968, Ser. No. 748,349
Int. Cl. H03b *3/04;* H03d *3/24;* H03k *3/26*
U.S. Cl. 329—122 19 Claims

ABSTRACT OF THE DISCLOSURE

An integrated frequency selective circuit particularly used for demodulating an FM signal which includes a phase locked loop having a phase comparator coupled to a low pass filter and amplifier which in turn has an output voltage which is the desired demodulated input signal and is coupled to a voltage controlled oscillator. The frequency output of the oscillator provides the other input to the phase comparator to complete the loop. With the use of the phase locked loop, tolerance variations greater than 10% in integral circuit elements can easily be tolerated. Back to back diodes may be incorporated in the circuits to provide limiting action for improved interference rejection.

BACKGROUND OF THE INVENTION

The present invention is directed to an integrated frequency selective circuit and demodulator and more specifically to such a circuit using a phase locked loop. The present invention utilizes what is known in the art as a phase locked loop. Such loops per se are known in the art as for example described in a book entitled Phaselock Techniques by Floyd M. Gardner, published by John Wiley & Sons in 1966. Such a phase locked loop has been utilized for discrete systems application such as aerospace telemetry. However, the large number of components needed in the discrete application of the phase locked loop system make it impractical and prohibitively expensive, especially for commercial communications applications.

In the commercial communications field the use of integrated circuits has not been widespread due to the fact that the individual integrated components of such circuits have a normal tolerance of plus or minus 20%. This is an inherent characteristic of the process used in forming integrated circuits. Lower tolerances have been achieved but at great expense. Thus in view of the tolerance limitation, the use of integrated circuits as for example in a communications receiver has not been practical since for example the intermediate frequency components of such a receiver must normally be accurate to within one/tenth of a percent.

OBJECTS AND SUMMARY OF INVENTION

It is a general object of the present invention to provide an improved frequency selective circuit.

It is a more specific object of the invention to provide a frequency selective circuit which is integrated and provides accurate demodulation action while utilizing integrated components having tolerances which are typical in integrated circuits.

It is another object of the invention to provide an integrated frequency selective circuit which is highly stable.

It is another object of the invention to provide an integrated frequency selective circuit in which the frequency which is selected may vary over a relatively large range.

It is another object of the invention to provide an integrated frequency selective circuit which requires no inductive elements.

It is another object of the invention to provide an integrated frequency selective circuit which has improved interference rejection characteristics.

It is another object of the invention to provide an integrated frequency selective circuit which selects frequencies by the use of a single tuned element.

In accordance with the above objects the frequency selective circuit of the present invention is responsive to an input signal within a predetermined range for providing an output signal identical in frequency to the input signal. The circuit comprises a semi-conductive substrate and a voltage controlled oscillator producing a signal having a frequency corresponding to the voltage magnitude of a control signal input. Phase comparator means compare the phase of the signal of the voltage controlled oscillator with the phase of the input signal and provide a difference signal indicative of the phase difference between the two signals. Means coupled to the phase comparator filters the difference signal to provide a filtered output signal. Such output signal is the control signal of the frequency selective circuit. The voltage controlled oscillator, phase comparator means, and filtering means each include a plurality of electrical circuit elements. The substantial majority of such elements are integrated into the semi-conductive substrate and have a tolerance variation greater than 10%.

DETAILED DESCRIPTION OF PREFERRED EMBODIMENTS

Figure 1:
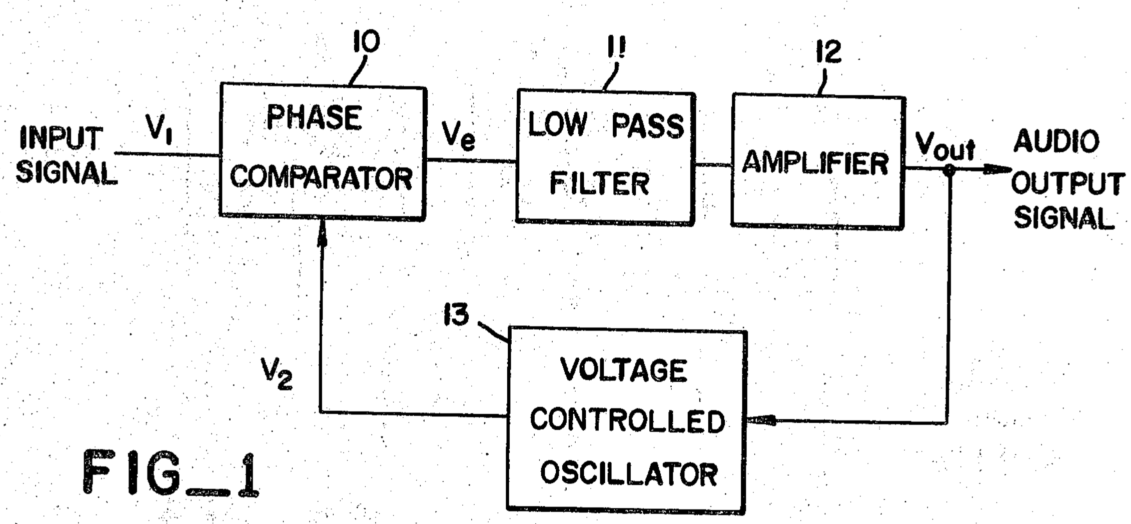
FIG. 1 is a block diagram of a frequency selective circuit embodying the present invention.

The block diagram illustrated in FIG. 1 shows what is termed in the art as a phaselock loop. The loop consists of three basic components: a phase detector or comparator 10 coupled in series to a low pass filter 11 which in turn is coupled through an amplifier 12 to a voltage controlled oscillator 13. Phase comparator 10 compares the phase of a periodic input signal $V_1$ against the phase of the output $V_2$ of voltage controlled oscillator 13. The output voltage, $V_e$, of comparator 10 is a measure of the phase difference between the input signal, $V_1$, and $V_2$. The magnitude of $V_e$ is dependent upon the number of error volts per unit of phase difference for which the phase comparator is designed. When the two signals $V_1$ and $V_2$ being compared have the same frequency, then the error voltage $V_e$ is proportional to the phase difference between the two inputs. In this mode the system is referred to as being "locked."

If the frequency of the input signal $V_1$ changes slowly, this results in a low frequency error voltage $V_e$. This error voltage is passed by low pass filter 11, amplified by amplifier 12, and then applied to the voltage controlled oscillator 13. This corrects the frequency of the reference signal $V_2$ to match and follow the incoming signal $V_1$. Thus the corrective voltage $V_e$, after being filtered and amplified, is a measure of the frequency deviation from equilibrium condition of the system. In frequency modulated (FM) systems, $V_e$ is therefore the desired demodulated output voltage which contains the audio information carried on the input carrier signal. Thus the phase locked loop performs the dual function of frequency selection and demodulation.

Frequency selection is obtained due to the presence of low pass filter 11 within the loop. Any input frequency that significantly differs from the frequency, $V_2$, of the voltage controlled oscillator 13 would produce a high frequency error voltage $V_e$. The output of phase comparator 10 would be filtered out or rejected by low pass filter 11 and thus would not appear at the output. Therefore the system responds only to those frequencies which are very near to the free running frequency of the voltage controlled oscillator 13 prior to the application of the information input signal $V_1$ and locks only on to this signal. Since the filter, in effect, modifies the loop gain, filters having a characteristic other than a simple low pass may be used to modify loop gain as desired.

Thus, in summary, the phase locked loop, once it selects a strong signal, will lock itself to the signal. It has the practical effect of providing selection of a narrow frequency range without the use of precision components. None of the four building blocks of the loop, namely phase comparator 10, low pass filter 11, amplifier 12, and voltage controlled oscillator 13, require adjustment to a precise value, since the circuit adjusts itself to the desired frequency.

Figure 2:
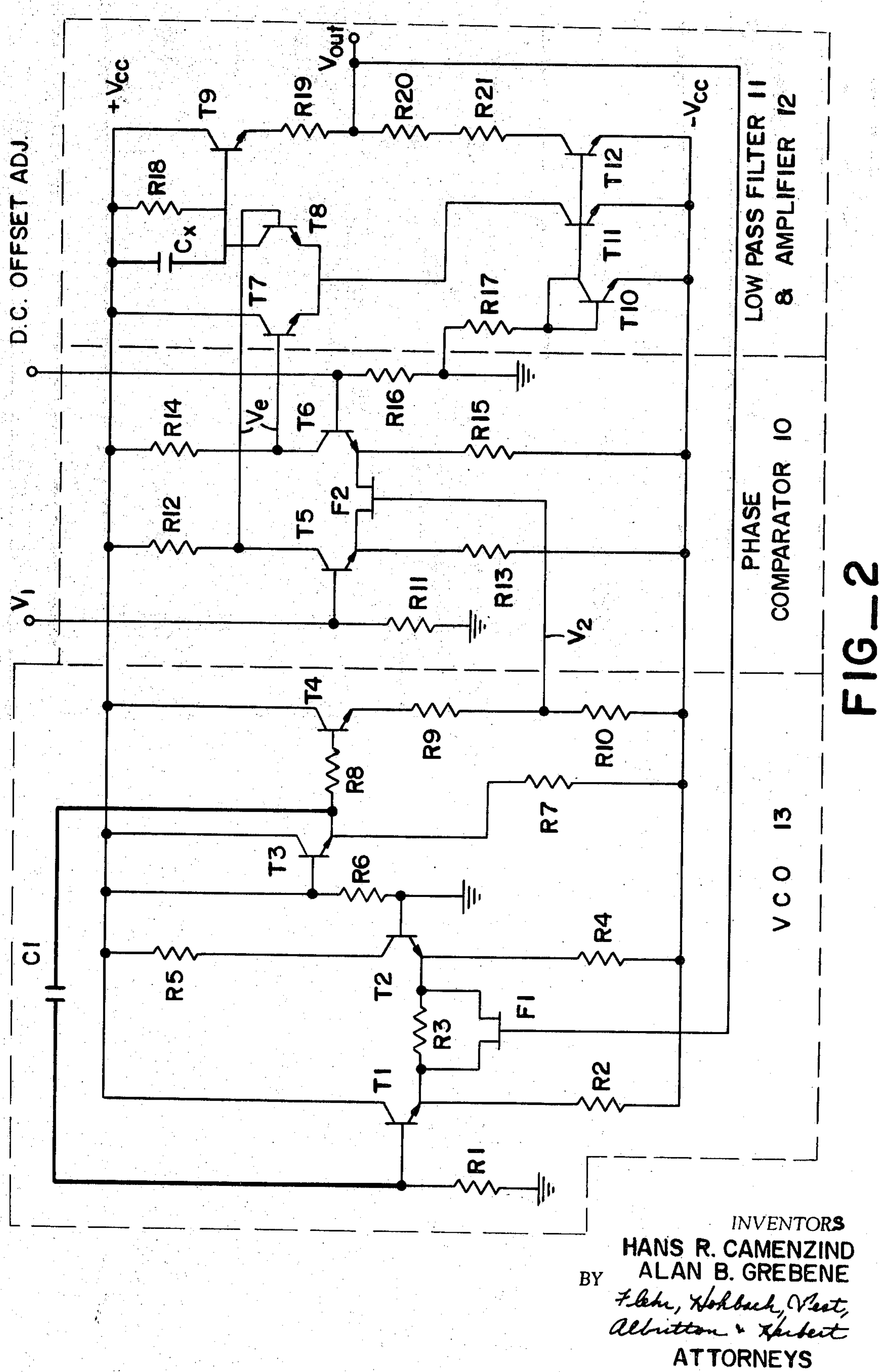
FIG. 2 is a schematic circuit diagram of FIG. 1.

More importantly, in accordance with the present invention the phase locked loop lends itself to realizations in a planar monolithic integrated circuit form since tight tolerances are not required. As stated above, the average tolerance in an integrated circuit of reasonable cost is of the range of plus or minus 20%. Accordingly, FIG. 2 is a schematic circuit diagram of the block diagram of FIG. 1 which is suitable for integration. FIG. 2 is shown in integrated form in FIG. 3 with similarly labeled components.

Referring now specifically to FIG. 2, the voltage controlled oscillator 13 includes the transistor components T1, T2, T3 and T4, and field effect transistor F1. Oscillator 13 has a circuit topology of the Wien Bridge type with the voltage $V_{out}$ being coupled into the gate of field effect transistor F1 to determine the output frequency of the oscillator on the line labeled $V_2$. In the Wein Bridge configuration control of the output frequency $V_2$ of the bridge is determined by modification of the loop gain of the voltage controlled oscillator circuit. This loop gain is proportional to the quotient of the quantity represented by the shunt combination of resistors R5 and R6 with the quantity represented by the shunt combination of the source-drain resistance of field effect transistor F1 with resistor R3 which shunts the gate and drain of transistor F1. Thus since the denominator of the quotient is determined by source drain resistance F1, the loop gain can therefore be controlled by modifying this resistance by varying the applied gate bias to F1. This gate bias is of course controlled by the voltage $V_{out}$. This, in effect, makes field transistor F1 act as a variable resistor connecting the emitters of bipolar transistors T1 and T2.

Referring to the circuit arrangement of FIG. 2 more specifically, transistor T3 buffers the feedback path from gain stage T2. Transistor T4 in turn also buffers the rest of the current from the output $V_2$ and thus avoids loading effects at the output terminal. The oscillation amplitude is determined by the saturation and cutoff of the gain stage T2. The circuits can be operated over symmetrical supply voltage ranges of 3 to 12 volts; the higher end of the voltage range is determined by the breakdown characteristics and properties of the bipolar transistors.

A significant advantage of the circuit topology used for the voltage controlled oscillator 13 is that the field effect transistor isolates the gate input on which the voltage control signal, $V_{out}$ is impressed from the remainder of the circuit. Thus DC biasing problems are eliminated. Frequency of oscillation is changed merely by changing the AC loop gain of voltage controlled oscillator 13.

The free running frequency of oscillation of the voltage controlled oscillator 13 is determined by the product of the quantity of the shunt combination of resistors R5 and R6 with the capacitance present in the circuit due to the parasitic collector to base capacitance of transistor T2 along with the values of resistor R1 and capacitor C1. This capacitor is indicated as being coupled into the circuit by a darker line since it would normally be external and be connected to the integrated circuit. While capacitor C1 could be easily integrated, it is preferred with current integrated circuit technology to construct it as a discrete external component. If, however, it is to be integrated, it can be realized as either a PN junction capacitor or as a metal-oxide-silicon type capacitor.

Phase comparator 10 compares input voltage $V_1$ with $V_2$ from voltage controlled oscillator 13. The error voltoutput, $V_e$, is taken from the collectors of transistors T5 and T6. From a general standpoint, a phase comparator circuit typically is a multiplier circuit where the two signals to be compared, $V_1$ and $V_2$, are effectively multiplied. The output, $V_e$, is then composed of the product of the two signals which is composed of several sum and difference frequency components. If the two frequencies are identical, then the lowest frequency component of the error voltage would be 0 frequency; that is, a DC error signal. This is the signal on which the phase locked loop, when it is locked on a signal, would operate. The phase comparator when fed by the resulting two signals of the same phase would have the property of providing a DC output voltage $V_{out}$ which would measure the phase difference between the two signals if the frequencies are the same. In other words the output voltage would follow any audio modulation imposed on the input carrier signal.

More specifically, the output signal $V_2$ of the voltage controlled oscillator 13 is coupled to the gate input of field effect transistor F2 which in turn is connected between the emitters of transistors T5 and T6. This connection is similar to that of voltage controlled oscillator 13 except that the field effect transistor F1 has resistor R3 shunting it and in the case of the phase comparator, there is no shunt resistor. However, the gain of the phase comparator stage is controlled by the voltage on the input terminal to F2. In addition to the dynamic source drain resistance of field effect transistor F2 determining the gain, the resistors R12 and R14 also are factors. The sensitivity of the comparator increases as the resistors R12 and R14 are made large with respect to the source drain resistance of F2. As was the case with the voltage controlled oscillator 13, the phase comparator can operate over a wide range of voltage supplies.

The terminal labeled DC Offset Adjustment coupled to the phase input of transistor T6 shifts the overall DC level of the phase locked loop. This provides for coarse tuning of the voltage controlled oscillator 13.

The output error voltage, $V_e$, of phase comparator 10 is taken from collectors of both T5 and T6. This provides for double the amount of gain as would occur from taking the output from one of these terminals alone.

Referring now to the combined low pass filter and amplifier 11, 12, the two outputs of $V_e$ are coupled to the base inputs of transistors T7 and T8. In this manner the full gain of the phase comparator 10 is utilized. Transistors T7 and T8 are voltage amplifiers. Transistor T9 forms a buffer output stage with the $V_{out}$ terminal. The output voltage in the preferred embodiment is shown as being taken from the lower terminal of resistor R19 which is coupled to the emitter of T9. However, depending upon the DC level desired, intermediate voltage taps can be utilized.

Desired current bias and DC levels are obtained from current sources provided by transistors T10, T11, and T12.

Low pass filter 11 is incorporated in the amplifier circuit by the use of a capacitor $C_x$ coupled between the collector of transistor T8 and power supply, $+V_{cc}$ and which also shunts resistor R18. The bandwidth of the filter is determined by the reciprocal of the product of the load resistance of transistor T8 which includes resistor R18 and the capacitance of capacitor $C_x$. Capacitor $C_x$ when used in a demodulator circuit for audio frequencies must be relatively large because of the bandwidth requirements of audio frequencies. In contrast when the circuit of the present invention is used for various FM applications with requirements here on the order of from 70 kilohertzs to 100 kilohertzs, the inherent parasitic capacitance of the devices are sufficient to eliminate any additional capacitor such as $C_x$. For example transistors typically have a finite gain bandwidth product. Increasing the voltage gain of a stage therefore implies that the bandwidth of that stage would be narrower. Since the gain of the present amplifier is relatively high, this means the bandwidth would be sufficiently narrow, especially for FM applications.

Thus, depending on the circuit application of external capacitors such as C1 in the case of voltage controlled oscillator 13 and $C_x$ can be eliminated so that the entire circuit shown in FIG. 2 can be made monolithically with no external components.

Thus the circuit of FIG. 2 requires no precision components, merely one external adjustment; that of the offset adjustment to adjust the DC levels in the circuit. All active devices and resistors of the circuit can be built monolithically by the use of conventional planar epitaxial or dielectric isolation techniques requiring no more than the state of the art diffused resistors and transistors.

Figure 3:
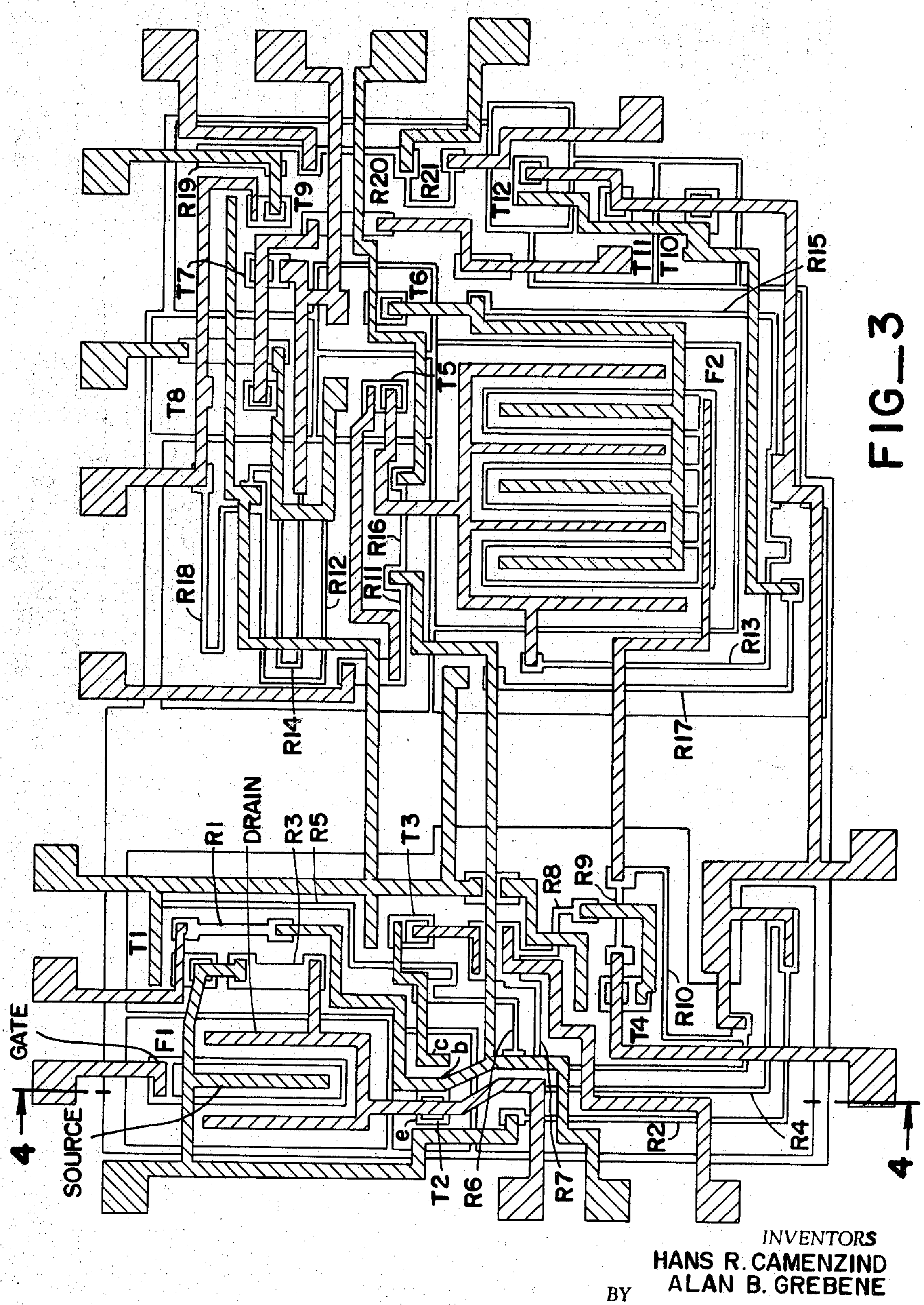
FIG. 3 is an elevational view somewhat simplified of an integrated circuit which is the equivalent of the circuit of FIG. 2.

Referring now to FIG. 3 which is an elevation view of an integrated circuit embodying the discrete components shown in FIG. 2, the circuit chip or substrate has a size of approximately 80 mils by 68 mils. The metal interconnections interconnecting the various circuit resistors and transistors are shown in the layout as cross-hatched. The alphanumeric indications correspond to those in FIG. 2. As discussed previously the only external components are the capacitors $C_x$ and C1. The values of these capacitors are:

| | Picofarads |
|---|---|
| C1 | 10 |
| $C_x$ | 1,000 |

The power supplies $V_{cc}$ would range from +/− six volts to +/− nine volts. Following are typical resistor values in kilo-ohms:

| | |
|---|---|
| R1 | 1.0 |
| R2 | 10.0 |
| R3 | 0.370 |
| R4 | 10.0 |
| R5 | 9.0 |
| R6 | 3.3 |
| R7 | 8.5 |
| R8 | 2.5 |
| R9 | 1.5 |
| R10 | 6.5 |
| R11 | 2.0 |
| R12 | 10.0 |
| R13 | 10.0 |
| R14 | 10.0 |
| R15 | 10.0 |
| R16 | 2.0 |
| R17 | 8.5 |
| R18 | 8.5 |
| R19 | 4.5 |
| R20 | 2.0 |
| R21 | 2.5 |

Referring now again to FIG. 3, as mentioned above the integrated circuit may be made by typical and well known prior art techniques utilizing for isolation either the diffused type isolation or dielectric isolation. A typical cross-section taken along the line 4—4 shows both types of isolation in FIGS. 4A and 4B respectively. In addition these are typical cross-sections showing both a field effect transistor, a resistor and a bipolar transistor.

Figure 4A:
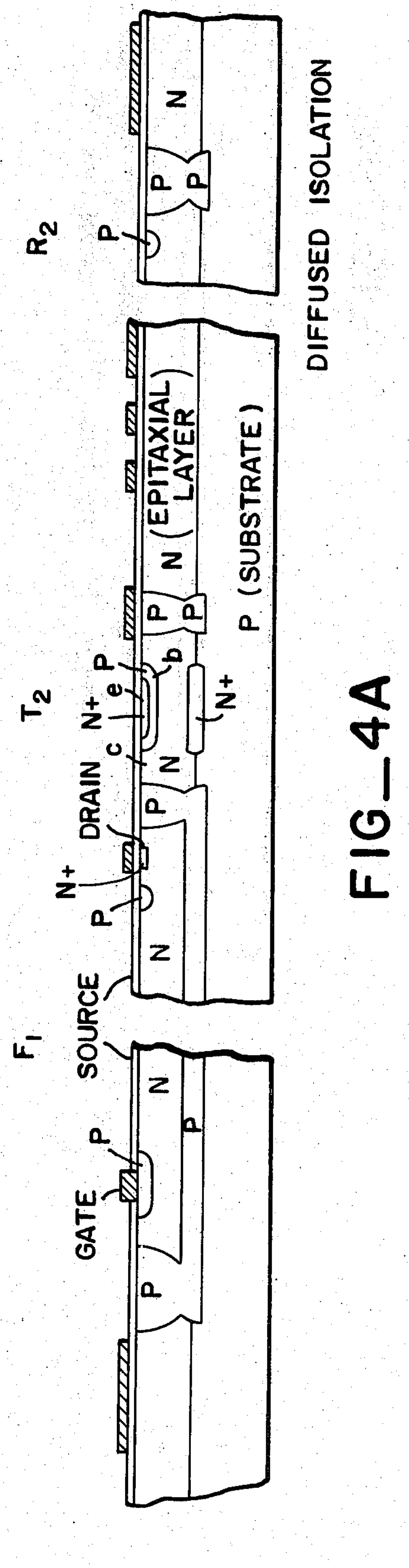
FIG. 4A is a cross-sectional view taken along the line 4—4 of FIG. 3, showing one type of integrated circuit.
Figure 4B:
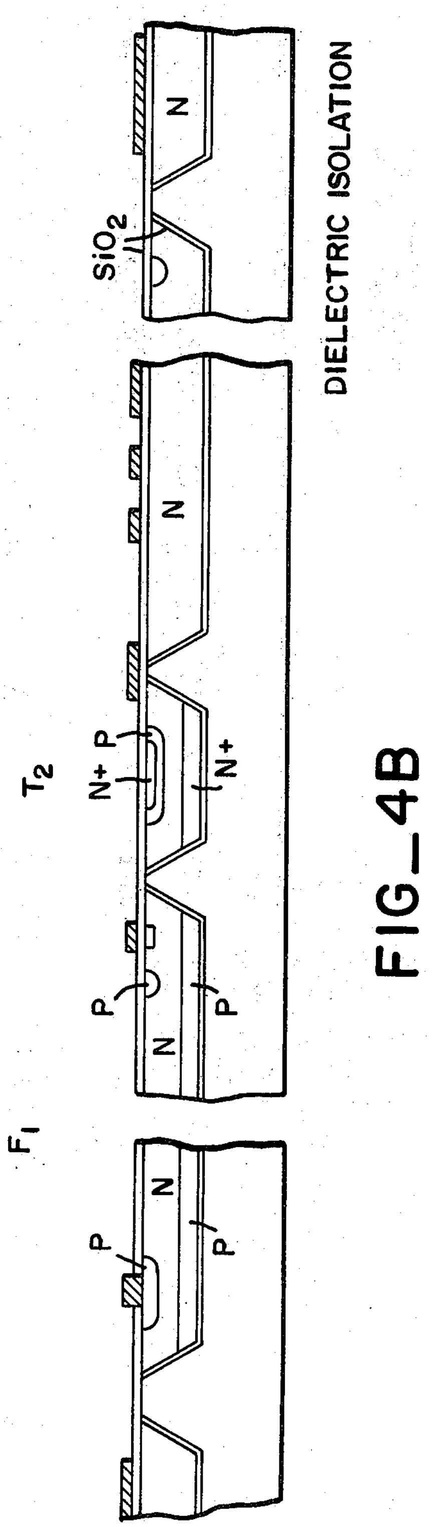
FIG. 4B is a cross-sectional view taken along the line 4—4 of FIG. 3 showing another type of integrated circuit.

The cross-section of FIG. 4A shows diffused isolation. Field effect transistor F1 is of the N channel junction type. This is merely a matter of convenience and metal oxide silicon type transistors can be equally used and are compatible with bipolar transistors. The channel of the field effect transistor is that portion underneath the metal electrode designated gate. Reference to FIG. 3 is also helpful in understanding the circular configuration of the gate electrode. The channel region itself is formed of N type material which is an epitaxial layer grown on the underlying P type substrate which serves as isolation. In comparison the field effect transistor of FIG. 4B isolates its underlying P substrate layer by a silicon dioxide dielectric isolation layer which in turn is formed on the substrate of polycrystalline silicon. The gate control region of both versions is a P type region and the drain an N+ region.

Transistor T2 is of the bipolar type and has a processing mode compatible with that of the field effect transistor. Specifically, the N type material serves as the channel in the field effect transistor and is the collector, designated *c*, of the transistor. The P type base region, designated *b*, of the transistor is diffused simultaneously with the P type control region of the gate. Lastly, the N+ source and drain regions are diffused at the same time as the emitter, designated *e*, of transistor T2. Thus in forming the field effect transistor structure, no extra diffusion steps are needed above and beyond those necessary for fabrication of a typical NPN bipolar structure. This is true for both the diffused isolation structure in FIG. 4A and the dielectric isolation of FIG. 4B.

The resistive elements of the integrated circuit are made by P type diffusion used in forming the gate of the field effect transistor as well as the base region of the NPN bipolar transistors. There results by this method a resistor structure that has a sheet resistivity of approximately 120–150 ohms per square.

The performance of the phase locked loop circuit shown in integrated form in FIGS. 2 and 3 can be improved from the point of view of selectivity in interference rejection by incorporating into the system a nonlinear limiting device.

In general, the phase locked loop has a unique ability of locking onto a signal and tracking that signal on small and slow variations. As the signal is varied from its equilibrium point, the error signal $V_e$ is then passed through the low pass filter and amplifier as discussed previously and applied to the control terminal of the voltage controlled oscillator. Thus, if the system has a large so-called loop gain, that is if the error signal of the phase comparator is amplified to a very high degree, then the voltage controlled oscillator has a very large amount of error signal available to it. Therefore, it can track a larger signal deviation from an equilibrium point. This is desirable for being able to hold on to a signal, but it is not desirable from the point of view that an undesired signal significantly away in frequency from the desired signal can now affect the loop since the error signal at the phase comparator due to this interference signal would now be amplified due to the large amplification and loop gain.

Therefore, it is desirable to have a large loop gain over only a narrow range of frequencies so that the output error signal swing is limited. Thus, if a very strong signal comes into the vicinity of the frequency at which the voltage controlled oscillator is presently operating, the momentary error signal $V_e$ would not pass a prescribed amount set by the so-called limiter property. In other words, the error signal will be clipped at two reference points about its equilibrium value. The limiter therefore gives the phase locked loop a very sharp rejection characteristic; that is, error signals will now be limited to only fixed amplitudes in spite of very large interference signals.

A first type of limiter circuit is shown in 5A where back to back diodes 21 and 22 are coupled to the $V_{out}$ line of the phase locked loop. These diodes would typically be non-ideal semiconductor PN junction diodes. Such diodes have a turn-on voltage of approximately 0.6 volt in a forward direction. The other terminal of the parallel connected diodes is coupled to a predetermined DC reference voltage.

In operation the voltage swing to the input of the voltage controlled oscillator 13 cannot exceed the DC reference voltage to which the diodes are connected by more than the diode turn-on voltage of .6 volt. If the signal swing becomes larger than .6 volt in either polarity, one or the other of the diodes 21, 22 will turn on and thereby shunt the signal to the reference voltage source. This in effect decreases loop gain to 0 and insures that the frequency of voltage controlled oscillator 13 is bound to a frequency interval related to the diode drop in either polarity direction.

Figure 5A:
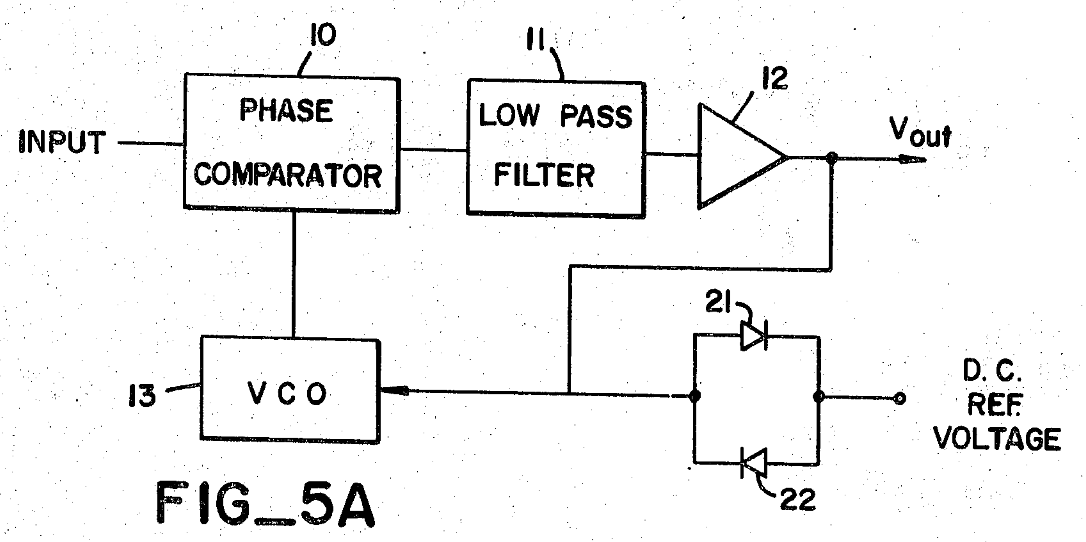
FIG. 5A is a block diagram showing an alternative embodiment of FIG. 1.
Figure 5B:
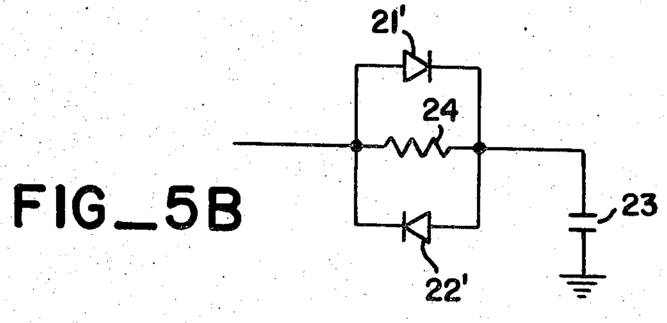
FIG. 5B is a schematic circuit diagram showing a modification of FIG. 5A.

A second embodiment illustrated in FIG. 5B incorporates back to back diodes 21', 22', but couples the other terminal of these diodes to a low AC impedance point provided by a capacitor 23 which is grounded. Resistor 24, which may have a value of approximately 10 kilohms, is coupled across 21' and 22' and provides a leakage path to self-bias each of the diodes so that for DC signals where capacitor 23 is an open circuit, none of the diodes turn on. For large AC signals which appear at $V_{out}$ however, the capacitor 23 becomes a virtual AC short circuit when the AC swing of $V_{out}$ exceeds the diode drop. Thus the alternative embodiment of FIG. 5B is responsive to the rate of change of $V_{out}$ after exceeding the diode drop value. This limiting characteristic may be of value in many specialized applications.

Limiters such as shown in FIGS. 5A and 5B can also be used to function in place of low pass filter 11. Thus, instead of filtering out significantly higher frequencies which would result from disturbance from a neighboring frequency channel, the limiter would instead filter or limit the higher voltage amplitude excursions caused by interference from a neighboring frequency channel.

In addition to FM demodulation the circuit of the present invention is also useful for AM detection and for continuous wave (CW) pulses such as used in teleprinter codes. In the case of AM detection the present circuit has the capability of producing a signal at the output of the voltage controlled oscillator which is identical in frequency to the AM carrier signal. Such a circuit is disclosed and claimed in a copending application entitled "Amplitude Demodulator Using a Phase Locked Loop," in the names of Camenzind et al., Ser. No. 800,998, filed Feb. 20, 1969. The two signals can then be compared to obtain the desired amplitude information. CW pulses are easily decoded since the circuit will first track the CW pulse and then operate in a free running mode in the absence of a pulse.

Thus, in summary, the present invention has provided a frequency selective circuit which may be integrated complying with the large tolerance requirements for present day integrated circuits, but which provides for precise demodulation or tracking of an input signal. The circuit requires no inductive components which are inherently difficult to integrate. Lastly, enhancement of circuit performance is achieved by provision of additional limiters to provide for improved interference rejection.

It is claimed:

1. A frequency selective circuit responsive to an input signal within a predetermined range for providing a signal identical in frequency to said input signal, the circuit comprising a semiconductive substrate, a voltage controlled oscillator for producing a signal having a frequency corresponding to the voltage magnitude of a control signal input, phase comparator means for comparing the phase of said signal of said voltage controlled oscillator with the phase of said input signal and for providing a difference signal indicative of the phase difference between said signals, means coupled to said phase comparator means and said voltage controlled oscillator for filtering said difference signal, the filtered output signal being said control signal of said frequency selective circuit, whereby the signal of said voltage controlled oscillator is identical to the frequency of said input signal, said voltage controlled oscillator, phase comparator means, and filtering means each consisting of a plurality of electrical circuit elements, substantially all of said elements being integrated into said semiconductive substrate and being formed exclusively of non-inductive type circuit elements, said circuit being capable of assimilating tolerances in said circuit elements of greater than 10%.

2. A frequency selective circuit as in claim 1 in which said input signal varies in frequency and said control signal is indicative of such frequency variation.

3. A frequency selective circuit as in claim 1 in which said voltage controlled oscillator, said phase comparator means, and said filtering means constitute a phase locked loop which locks onto said input signal and follows any frequency variation of such signal over a pretermined frequency interval.

4. A frequency selective circuit as in claim 1 in which said voltage controlled oscillator has a predetermined free running frequency of oscillation and said circuit locks onto and follows the frequency of an input signal within said predetermined frequency range which includes said free running frequency, said range being determined by said filtering means.

5. A frequency selective circuit as in claim 4 in which said filtering means provides a sharply defined frequency range.

6. A frequency selective circuit as in claim 1 in which said filtering means consist of a resistor-capacitor network.

7. A frequency selective circuit as in claim 1 in which said filtering means limits the frequency excursions of said difference signal.

8. A frequency selective circuit as in claim 1 in which said filtering means is a frequency filter of the low pass type.

9. A frequency selective circuit as in claim 1 together with limiting means coupled to said filtering means for limiting the amplitude excursions of said filtered output signal.

10. A frequency selective circuit as in claim 9 in which said limiting means includes back to back connected diodes.

11. A frequency selective circuit as in claim 10, in which said diodes are coupled to a DC reference voltage whereby said diodes become conductive when the excursions of said filtered output signal exceed predetermined limits.

12. A frequency selective circuit as in claim 10 in which said diodes are coupled to a low AC impedance point whereby said diodes become conductive when the rate of change of said filtered output signal exceeds a predetermined value.

13. A frequency selective circuit as in claim 9 in which said voltage controlled oscillator, said phase comparator means, and said filtering means are series connected to form a control loop having a relatively high gain and in which said limiting means is coupled to said loop and is responsive to the amplitude excursions of said filtered output signal exceeding predetermined limits to reduce said loop gain to a relatively low value.

14. A frequency selective circuit as in claim 1 in which said integrated elements are electrically isolated from each other by diffused isolation regions inset in said substrate.

15. A frequency selective circuit as in claim 1 in which said integrated elements are electrically isolated from each other by a dielectric barrier in said substrate.

16. In an integrated circuit usable as a single tuned unit for frequency selection from an input signal, a semiconductor body, a phase locked loop formed exclusively of noninductive circuit elements, substantially all of said circuit elements being formed in said semiconductor body, said phase locked loop including an input terminal for receiving the input signal, a phase comparator having a first input coupled to the input terminal and a second input and an output, a low pass filter coupled to the output of the phase comparator, and a voltage controlled oscillator coupled to the output of the filter and to the second input of the phase comparator, said phase locked being capable of assimilating tolerances in the circuit elements of greater than 10% while being able to lock onto an input signal with said oscillator oscillating at the frequency of said input signal.

17. An integrated circuit as in claim 16 in which said input signal varies in frequency and the output of the filter provides a signal indicative of such frequency variation.

18. An integrated circuit as in claim 16 in which said low pass filter provides a sharply defined frequency range.

19. An integrated circuit as in claim 16 in which said filtering means limits the frequency excursions of said difference signal.

References Cited

UNITED STATES PATENTS

| | | | |
|---|---|---|---|
| 3,090,017 | 5/1963 | Novic | 307—237X |
| 3,125,694 | 3/1964 | Palthe | 307—237X |
| 3,221,260 | 11/1965 | Henrion | 331—23X |
| 3,277,390 | 10/1966 | McLin | 331—25 |
| 3,293,087 | 12/1966 | Porter | 307—303X |
| 3,328,719 | 6/1967 | DeLisle et al. | 331—25X |
| 3,355,669 | 11/1967 | Avins | 307—303X |
| 3,428,900 | 2/1969 | Newton | 325—346 |

ALFRED L. BRODY, Primary Examiner

U.S. Cl. X.R.

307—303; 325—346, 419; 331—23, 108

PO-1050
(5/69)

UNITED STATES PATENT OFFICE
CERTIFICATE OF CORRECTION

Patent No. 3,564,434 Dated February 16, 1971

Inventor(s) H. R. Camenzind et al

It is certified that error appears in the above-identified patent and that said Letters Patent are hereby corrected as shown below:

IN THE CLAIMS:

| | |
|---|---|
| Claim 1, Column 7, line 75 | Cancel "a con-" and substitute therefor -- |
| Column 8, line 1 | Cancel "trol" |
| Claim 16, Column 9, line 14 | After "locked" insert --loop-- |

Signed and sealed this 16th day of April 1974.

(SEAL)
Attest:

EDWARD M.FLETCHER,JR.
Attesting Officer

C. MARSHALL DANN
Commissioner of Paten